(12) United States Patent
Smith et al.

(10) Patent No.: US 8,153,888 B2
(45) Date of Patent: Apr. 10, 2012

(54) LATERAL ULTRA-HIGH EFFICIENCY SOLAR CELL

(75) Inventors: Joseph T. Smith, Columbia, MD (US); James N. Halvis, Severna Park, MD (US); Thomas J. Knight, Silver Spring, MD (US)

(73) Assignee: Northrop Grumman Systems Corporation, Los Angeles, CA (US)

( * ) Notice: Subject to any disclaimer, the term of this patent is extended or adjusted under 35 U.S.C. 154(b) by 565 days.

(21) Appl. No.: 12/113,257

(22) Filed: May 1, 2008

(65) Prior Publication Data
US 2009/0320913 A1  Dec. 31, 2009

(51) Int. Cl.
H01L 31/00 (2006.01)
H01L 21/00 (2006.01)

(52) U.S. Cl. .......................... 136/255; 438/72
(58) Field of Classification Search .................. 136/255; 438/72; 257/E31.127
See application file for complete search history.

(56) References Cited

U.S. PATENT DOCUMENTS

| | | | |
|---|---|---|---|
| 4,204,881 A * | 5/1980 | McGrew | 136/246 |
| 4,268,709 A | 5/1981 | Boling | |
| 4,268,842 A | 5/1981 | Jacob et al. | |
| 4,316,048 A | 2/1982 | Woodall | |
| 4,653,472 A | 3/1987 | Mori | |
| 4,834,805 A | 5/1989 | Erbert | |
| 5,322,572 A | 6/1994 | Wanlass | |
| 5,853,497 A | 12/1998 | Lillington et al. | |
| 6,469,241 B1 | 10/2002 | Penn | |
| 6,515,217 B1 | 2/2003 | Aylaian | |
| 7,208,674 B2 | 4/2007 | Aylaian | |
| 7,227,077 B2 | 6/2007 | Kleinwachter | |
| 2004/0084077 A1 | 5/2004 | Aylaian | |
| 2005/0127379 A1 | 6/2005 | Nakata | |
| 2006/0266982 A1 * | 11/2006 | Su et al. | 252/500 |
| 2006/0272698 A1 | 12/2006 | Durvasula | |
| 2007/0084503 A1 | 4/2007 | Huang et al. | |
| 2007/0107769 A1 | 5/2007 | Cobb | |

OTHER PUBLICATIONS

Barnett et al., "Milestones Toward 50% Efficient Solar Cell Modules", Sep. 3, 2007, 22nd European Photovoltaic SSolar Energy Conference, Milan, Italy, pp. 1-6.*
Barnett, et. al., "50% Efficient Solar Cell Architectures and Designs", 1-4244-0016-3/06, 4th World Conference on Photovoltaic Energy Conversion, 2006.
Martin A. Green, " Solar Cells, Operating Principles, Technology, and System Applications", 1992, pp. 212-217.
Jenny Nelson, "The Physics of Solar Cells", Imperial College Press, 2005, pp. 298-303.

* cited by examiner

Primary Examiner — Basia Ridley
Assistant Examiner — Tamir Ayad
(74) Attorney, Agent, or Firm — Marsteller & Associates, P.C.

(57) ABSTRACT

A high-efficiency lateral multi-junction solar cell (C) includes ultra-low profile planar spectral band splitting micro-optics having a shortpass filter (48) reflecting desired frequencies of light (24) to a reflective mirror (58) combined with spectrally optimized photovoltaic (solar) cells.

21 Claims, 7 Drawing Sheets

LATERAL ULTRA-HIGH EFFICIENCY SOLAR CELL

BACKGROUND OF THE INVENTION

1. Technical Field

The invention relates to the field of solar cells, and more particularly to a solar cell which includes an array of long and short wavelength photovoltaic cells on a substrate.

2. Background Art

Solar cells are solid-state devices that directly convert sunlight into electricity. This conversion is typically called the photovoltaic effect, which is the physical process through which the solar cell converts photons from incident sunlight directly into electricity—with the photon energy ($E_{ph}$) proportional to the incident sunlight's wavelength ($\lambda$) with $E_{ph}=1.24/\lambda$. Incident light on the solar cell produces both a DC current (I) and voltage (V) that delivers electric power (Power=V×I) to an external load.

Under illumination, incident photons are absorbed, creating electron-hole pairs. The electron-hole pairs are separated and collected by an internal electric field—typically a PN junction—followed by the movement of higher energy electrons from the solar cell into an external circuit. The electrons then dissipate their energy in the external load and return to the solar cell—ultimately recombining with holes. The DC current (I) is proportional to the intensity of the incident sunlight, while the DC voltage (V) is related to the energy band-gap (Eg) of the solar cell material. For example, a solar cell under more intense sunlight, such as under optical concentration, will generate more DC current (FIG. 2), while a solar cell made of a material with a wider band-gap (Eg) will result in a higher DC voltage.

At a slightly more detailed level (FIG. 3), incident photons are absorbed and generate electron-hole pairs if their energy is equal to (or greater) than the energy band-gap (Eg) of the solar cell material (case 2 and 3)—while photons with energy less than the band-gap (case 1) are not absorbed and do not generate electrical current. For case 3, photons with energy ($E_{ph}$) greater than the band gap, the excess photon energy is lost as heat since the carriers will instantaneously thermalize (decay) in energy to the edges of the band-gap.

Solar cell efficiency equals the generated power (V×I) divided by the incident power. Hence, for a fixed incident power, higher efficiency implies that the cells output voltage and/or current must be increased. For a solar cell material with single band-gap (Eg), sunlight's broad spectrum sets a limit on how much power (V×I) can theoretically be generated. This concept is best illustrated by referring to FIG. 4. First, assume a single-junction solar cell material with a band-gap ($E_g$) of 2.4 eV. Incident photons with energy ($E_{ph}$) less than the band-gap energy of 2.4 eV will not be absorbed and, of course, will not generate any current (I). Looking at the solar spectrum plot in FIG. 4, greater than 75% of incident sunlight consists of photons with energies less than 2.4 eV which are not absorbed and thus will not contribute to the output current. So, while the DC voltage for a large 2.4 eV band-gap is more than double that of a 1.1 eV bandgap (silicon) cell, the efficiency of the 2.4 eV cell will be less than 25%, since 75+% of incident sunlight is not collected.

Alternatively, for a solar cell with a narrow band-gap (Eg) of 0.95 eV, all sunlight with a wavelength less than 1.3 µms is absorbed, which from the curve, translates to greater than 75% of the incident sunlight being absorbed. However, while the DC current is maximized with a small Eg (0.95 eV), the output voltage (V) is much less, limiting the maximum solar cell efficiency to approximately 30% (V×I). Again, this is case 3 (FIG. 3), where the voltage difference between the photon energy (1.24/$\lambda$) and the energy band-gap (Eg) is directly lost to heat within the solar cell due to the generated carriers (electron-hole pairs) instantaneously decaying (thermalizing) to the band-gap edges.

Single energy band-gap (single junction) solar cells are considered to have a fairly low theoretical upper efficiency limit. To get around this inherent physical limitation, one method to increase theoretical solar cell efficiency is to simply construct a solar cell more than one band-gap ($E_g$). As illustrated in FIG. 5, the conventional approach is to vertically stack a wide bandgap semiconductor on top of progressively narrower bandgap semiconductors (a.k.a., vertical Tandem Solar Cells). The top cells are able to more efficiency absorb higher energy photons, minimizing thermalization losses and allowing lower energy photons to be transmitted to the progressively narrower band-gap layers. However, tandem cells require extremely complex processing for both lattice and current matching; typically can not be contacted separately; plus require complex and transparent vertical tunnel junctions to connect in a series manner the vertically stacked solar cells. Lattice mismatch can lead to a number of problems that degrade energy efficiency, including high defect density, rough surface morphology—plus epitaxial layer cracking, bowing, and/or warping (i.e., vertically stacked tandem cells can end up resembling both the shape as well as the surface of a potato chip). See, 1. Barnett, et. al., "50% Efficient Solar Cell Architectures and Designs," IEEE 1-4244-0016-3/06, 4th World Conference on Photovoltaic Energy Conversion, 2006 (referred to as "Burnett").

An approach that allows the different bandgap solar cells to be manufactured separately and placed adjacent to each other (laterally) and thus contacted separately eliminates the need for precise current and lattice matching along with somewhat reducing the manufacturing complexity associated with vertical tandem solar cells. However, laying single-bandgap cells next to each other (instead of being vertically stacked) eliminates the efficiency gains—unless the incident sunlight can somehow be spectrally split and then concentrated.

FIG. 6 (see Burnett) illustrates a recent lateral solar cell architecture (and a prior art example) where the incident sunlight is split into three spectral components (red/green/blue) and then focused using a static concentrator onto three separately contacted (adjacent) solar cells—each designed with an optimum band-gap for the incident light spectrum. From Burnett, "The lateral solar cell architecture increases the choice of materials for multiple junction solar cells, since it avoids lattice and current matching constraints. Further, since the devices do not need to be series connected, spectral mismatch losses are reduced. Finally, by contacting the individual solar cells with individual voltage busses, the need for tunnel junctions is avoided. Since each material requires unique (and transparent) tunnel junction contact metallurgy, eliminating tunnel junctions represents a substantial simplification".

The theoretical efficiency for an optimum band-gap single lateral solar cell architecture type device, as shown in FIG. 6 as an example, should show theoretical efficiency improvements for these multi-junction solar cells. For example, the theoretical efficiency for an optimum band-gap single junction solar cell may be 32.4%, while a three-junction solar cell (lateral or tandem) may have a theoretical efficiency of 50.3%. See, Martin A. Green, "Solar Cells, Operating Principles, Technology, and System Applications", 1992.

In general a multi-junction, monolithic, photovoltaic solar cell device is provided for converting solar radiation to photocurrent and photovoltage with improved efficiency. Such a solar cell device comprises a plurality of semiconductor cells, i.e., active p/n junctions, connected in tandem and deposited on a substrate fabricated from Gallium Arsenide (GaAs) or Germanium (Ge). To increase efficiency, each semiconductor cell is fabricated from a crystalline material with a lattice constant substantially equivalent to the lattice constant of the substrate material. Additionally, the semiconductor cells are selected with appropriate band gaps to efficiently create photovoltage from a larger portion of the solar spectrum. In this regard, one semiconductor cell in each embodiment of the solar cell device has a band gap between that of Ge and GaAs. To achieve desired band gaps and lattice constants, the semiconductor cells may be fabricated from a number of materials including Germanium (Ge), Gallium Indium Phosphide (GaInP), Gallium Arsenide (GaAs), GaInAsP, GaInAsN, GaAsGe, BGaInAs, (GaAs)Ge, CuInSSe, CuAsSSe, and GaInAsNP, for example.

By now it should be clear that a lateral multi-junction solar cell architecture is very appealing for quite a few reasons. However, as evident in FIG. 6 (prior art), the illustrated lateral solar cell architecture is not very compact—as compared to a vertical tandem multi-junction cell—with the 'add-on' optics increasing the overall solar cell thickness by at least 1 cm. Additionally, the illustrated 'bulky' macro-optics configuration results in quite a bit of empty or unused space between the solar cells—increasing the overall solar panel area as compared to a comparable performance vertical tandem cell. In addition to not being very compact (thin), known lateral solar cells (see FIG. 6 as an example) also involve a fairly complex and expensive assembly process that requires precise alignment of external optics to the individual solar cells.

For terrestrial or even spacecraft-based portable power and recharging applications where compactness combined with high efficiency is key due the low available surface area—such as on a cell phone, Blackberry, iPod, or a Soldiers Helmet—the 'ideal' solar cell architecture would be one that offers the 'compact' (thin and light) high conversion efficiency of a vertical multi-junction tandem, but with the inherent 'simplicity' and potentially lower manufacturing cost of a lateral architecture multi-junction solar cell.

While the above cited references introduce and disclose a number of noteworthy advances and technological improvements within the art, none completely fulfills the specific objectives achieved by this invention.

DISCLOSURE OF INVENTION

In accordance with the present invention, a high-efficiency lateral multi-junction tandem solar cell includes a micro-lens layer that has an upper surface formed to concentrate incident light impinging on the solar cell. The micro-lens layer is preferably formed from a low refractive index material.

A primary, such as a P− type, semiconductor substrate slab layer, preferably of Silicon, has an upper surface and a lower surface. A comparable, such as a P+ type, semiconductor layer has an upper surface mated to the lower surface of the P− type semiconductor substrate slab. The P+ semiconductor layer further has an opposing lower surface with an attached reflective backside contact layer.

The upper surface of the primary substrate slab layer is apportioned or divided into a desired pattern of a plurality of alternating areas either having N+ semiconductor segments or Indium Gallium Nitride (InGaN) members. The N+ semiconductor segments are formed or embedded beneath and extending essentially upwards even with the upper surface of the P− type semiconductor slab layer. The InGaN members have a lower surface in contact with the upper surface of the P− type substrate slab layer and form a short wavelength color band photovoltaic cell.

The InGaN members further have an opposing upper surface that has a short-pass filter element formed with the upper surface of such InGaN members.

A refractive surface member is formed from a high refractive index material having a lower surface mating with the upper surface of the P− substrate slab layer and an upper surface mating with a lower surface of the micro-lens layer.

A pattern of reflective mirrors is formed on the upper surface of the refractive surface member to reflect light between the reflective mirrors and the N+ semiconductor segments and the InGaN members.

Low cost combined with high efficiency is today's defining problem for Solar Cell technology development. This disclosure describes a novel solution employing a new compact micro-optics technology that offers the high efficiency of conventional vertical tandem solar cells, but with much less manufacturing complexity. The novel design combines ultra-low profile planar spectral band splitting micro-optics with spectrally optimized photovoltaic (solar) cells to create a compact high-efficiency lateral multi-junction 'tandem-style' solar cell.

The disclosed invention is intended for surface mounted portable power and recharging applications where compactness combined with high efficiency is key due the low available surface area—such as on a cell phone, Blackberry, iPod, or a soldiers helmet/backpack. Or more simply, the solar cell technology that offers the highest efficiency in the thinnest and lightest form factor combined with the lowest manufacturing cost will win—which is exactly what the disclosed lateral multi-junction solar cell concept offers. An interesting and fairly topical application for this technology would be as a car rooftop mounted battery re-charger for a plug-in hybrid automobile. A 30% efficient solar array covering most of a cars roof would provide about 1.5 Kw, which is enough battery recharging power for between 5 to 10 miles of driving range—assuming the car is able to sit out in the sun most of the day. For typical short daily commutes of approximately 20 miles, this easily translates into >80 mpg of equivalent fuel efficiency.

These and other objects, advantages and preferred features of this invention will be apparent from the following description taken with reference to the accompanying drawings, wherein is shown the preferred embodiments of the invention.

BRIEF DESCRIPTION OF DRAWINGS

A more particular description of the invention briefly summarized above is available from the exemplary embodiments illustrated in the drawing and discussed in further detail below. Through this reference, it can be seen how the above cited features, as well as others that will become apparent, are obtained and can be understood in detail. The drawings nevertheless illustrate only typical, preferred embodiments of the invention and are not to be considered limiting of its scope as the invention may admit to other equally effective embodiments.

MODE(S) FOR CARRYING OUT THE INVENTION

So that the manner in which the above recited features, advantages and objects of the present invention are attained can be understood in detail, more particular description of the invention, briefly summarized above, may be had by reference to the embodiment thereof that is illustrated in the appended drawings. In all the drawings, identical numbers represent the same elements.

Figure 1:
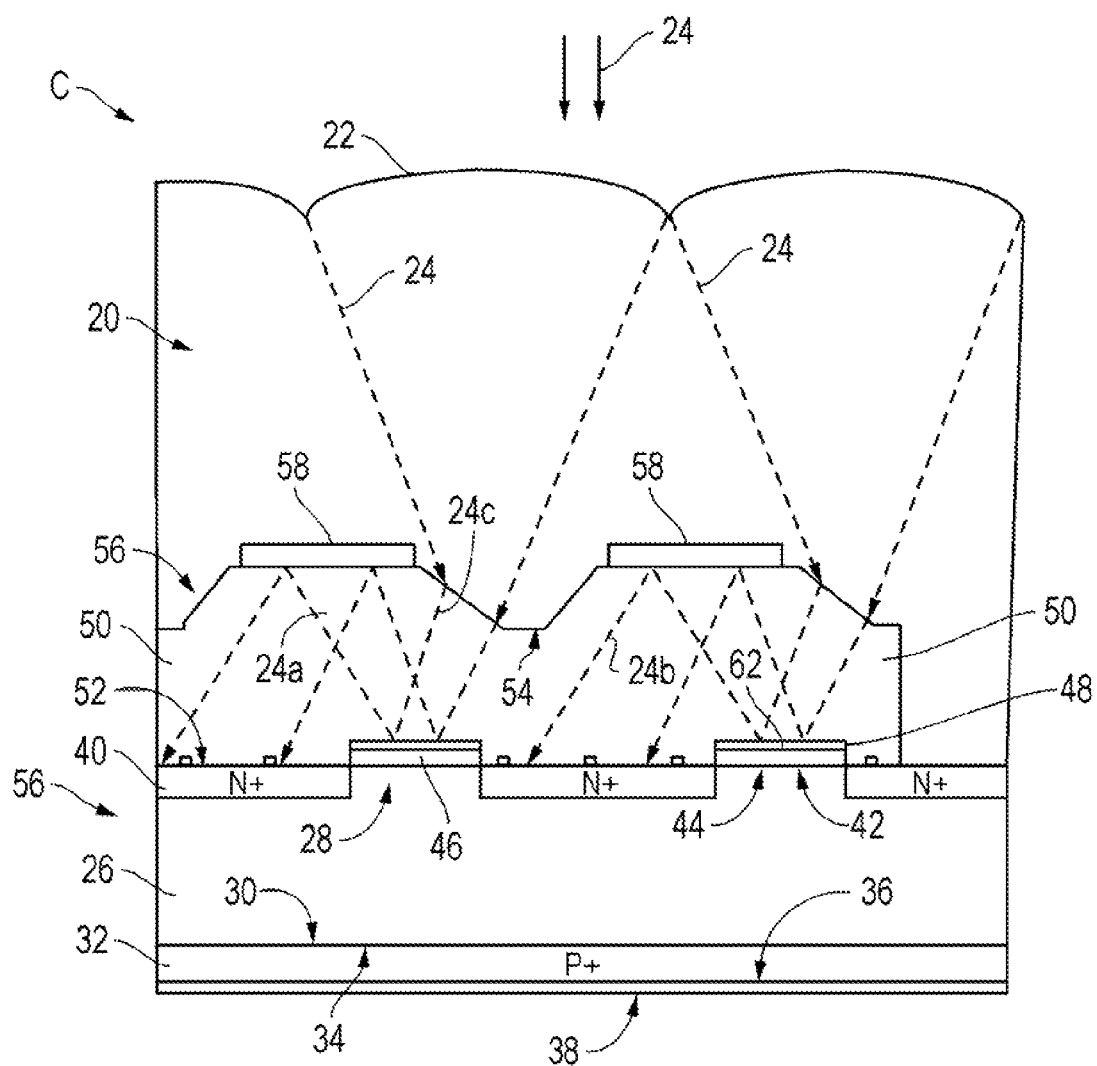
FIG. 1 is a cross-sectional view depicting a lateral ultra-high efficiency multi-junction solar cell with integrated micro-optics of the present invention.

Referring particularly to FIG. 1, a high-efficiency lateral multi-junction tandem solar cell C of the present invention includes a micro-lens layer 20 that has an upper surface 22 formed into a micro-lens configuration to concentrate incident light or signal 24 impinging on the upper surface 22 of the solar cell C. The micro-lens layer 20 is preferably formed from a low refractive index material.

A primary, such as a P− type, semiconductor substrate slab layer 26, preferably of Silicon (Si), has an upper surface 28 and a lower surface 30. A comparable, such as a P+ type, semiconductor layer 32 has an upper surface 34 mated to the lower surface 30 of the primary semiconductor substrate slab 26. The P+ semiconductor layer 32 further has an opposing lower surface 36 with an attached reflective backside contact layer 38.

The upper surface 28 of the primary type substrate slab layer 26 is apportioned or divided into a desired pattern of a plurality of alternating areas either having first semiconductor, such as N+ type, segments 40 or second wavelength color band photovoltaic members or elements 42. The first semiconductor cells or segments 40 are formed or embedded beneath and extending essentially upwards even with the upper surface 28 of the primary semiconductor slab layer 26. The second photovoltaic cells or members 42 may be an Indium Gallium Nitride (InGaN) type element comparable with the substrate layer 26, and have a lower surface 44 in contact with the upper surface 28 of the primary substrate slab layer 26 thereby forming a short wavelength color band photovoltaic cell.

The second or InGaN members 42 further have an opposing upper surface 46 that has a short-pass filter or beam splitter element 48 formed with the upper surface 46 of such second InGaN members 42.

A refractive surface member 50 is formed from a high refractive index material having a lower surface 52 mating with the upper surface 28 of the primary substrate slab layer 26 and an upper surface 54 mating with a lower surface or edge 56 of the micro-lens layer 20.

A pattern of reflective mirrors 58 is formed on the upper surface 54 of the refractive surface member 50 at the interface between the micro-lens layer 20 and the refractive surface member 50 to reflect light 24 between an underside surface of the reflective mirrors 58 and the first N+ semiconductor cells or segments 40 and the beam splitter element 48 with the second InGaN cells or members 42.

The present invention is an approach to provide the 'ideal' multi-junction solar cell C that is both very compact as well as highly efficient, but does not have inherent limitations of conventional vertical tandem solar cells. The present invention replaces the fairly large macro-optics configuration used in known conventional lateral multi-junction solar cells with an ultra-low profile planar spectral band splitting micro-optics merged with integrated InGaN-on-Silicon Technology (FIG. 1).

Integrated circuit (microelectronics) manufacturing technology now permits the fabrication of not only the solar cell semiconductor layer (photo-diodes), but also allow for the integration of very low-profile (planar) micro/nano-optical components using conventional monolithic semiconductor tooling. Merging both optical and electronic components on-chip is believed to be an efficient approach for significantly reducing the size, weight, volume, complexity and cost of systems as well as improving overall reliability, uniformity, operational capability and performance.

In a sense, the disclosed lateral solar cell configuration C of the present invention can be considered as a single electro-optical system on chip. Instead of a separate (external) system level beam splitter, an integrated (on the silicon surface) dichroic beam splitter is mated (optically aligned) to a micro-lens. Functionally as shown in FIG. 1, an inclined high index (of refraction) surface or layer 50, in conjunction with a low index capping layer 20, refracts the signal or beam of light 24c from the micro-lens 20 to the integrated (miniature) dichroic filter 48 and its collection photo-diode (photovoltaic layer) 46. A photo-diode 56 comprising the substrate layer 26 and the InGaN members 46 collects either the longwave or shortwave portion of the signal 24 depending upon which dichroic mirror is employed (longpass or shortpass filter, respectively). A separate mirror 58 is then used to reflect the shortwave (or longwave) portion of the signal 24 from the dichroic beam splitter 48 to a second collection photo-diode 40.

Figure 11:
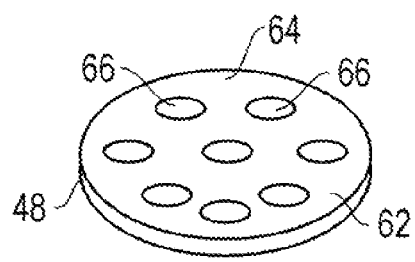
FIG. 11 is a top perspective view of a short-pass filter.
Figure 2:
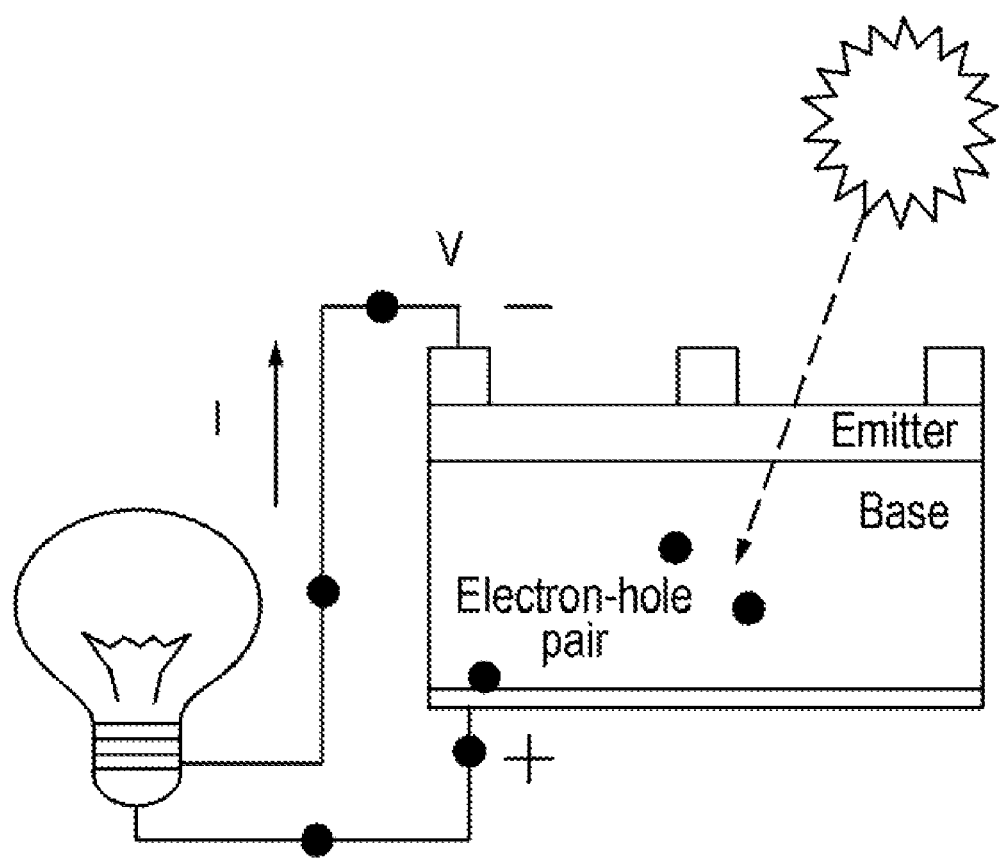
FIG. 2 depicts a solar cell operation.
Figure 3:
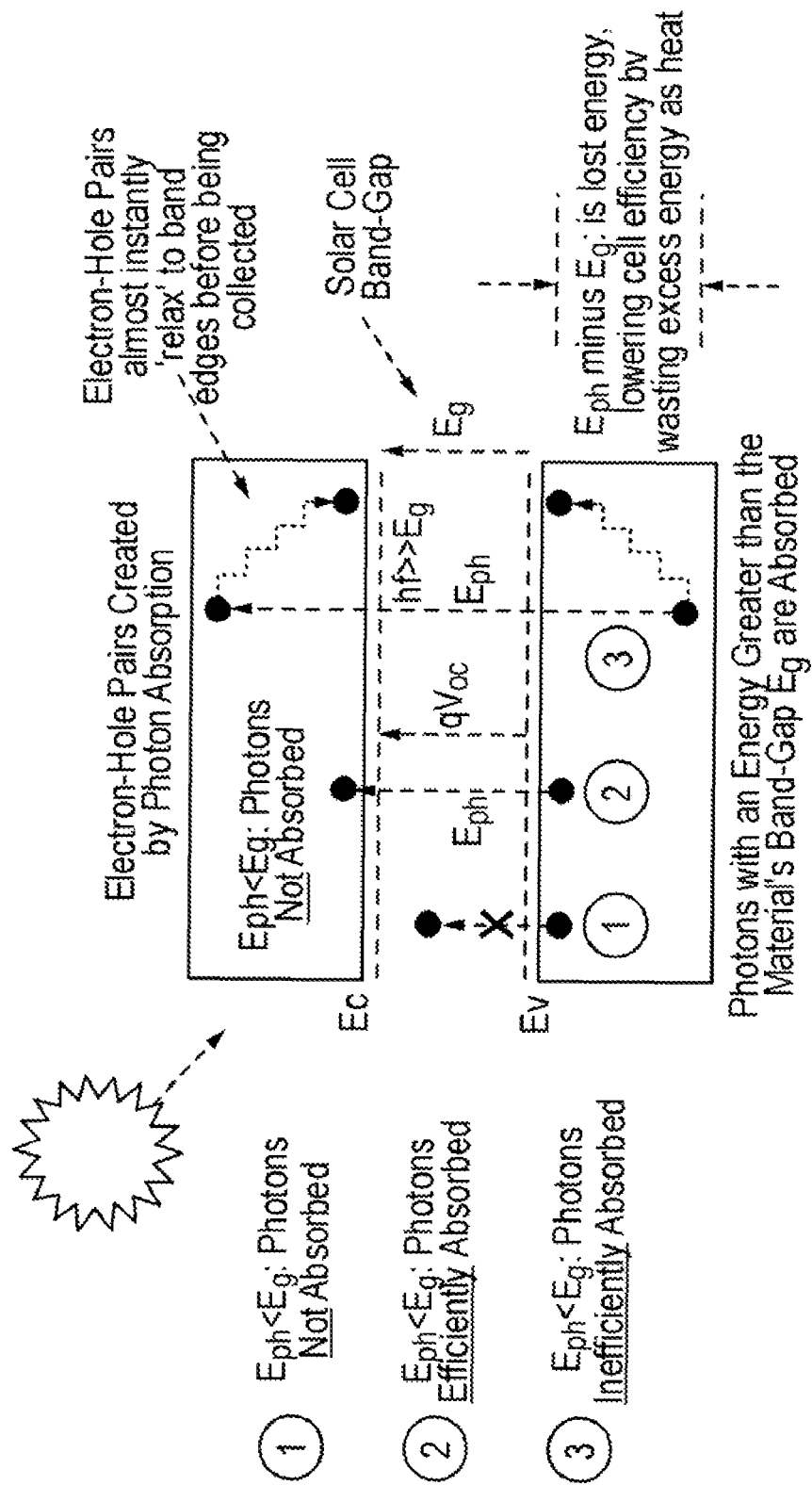
FIG. 3 shows a relationship between solar cell band-gap and optical absorption.
Figure 4:
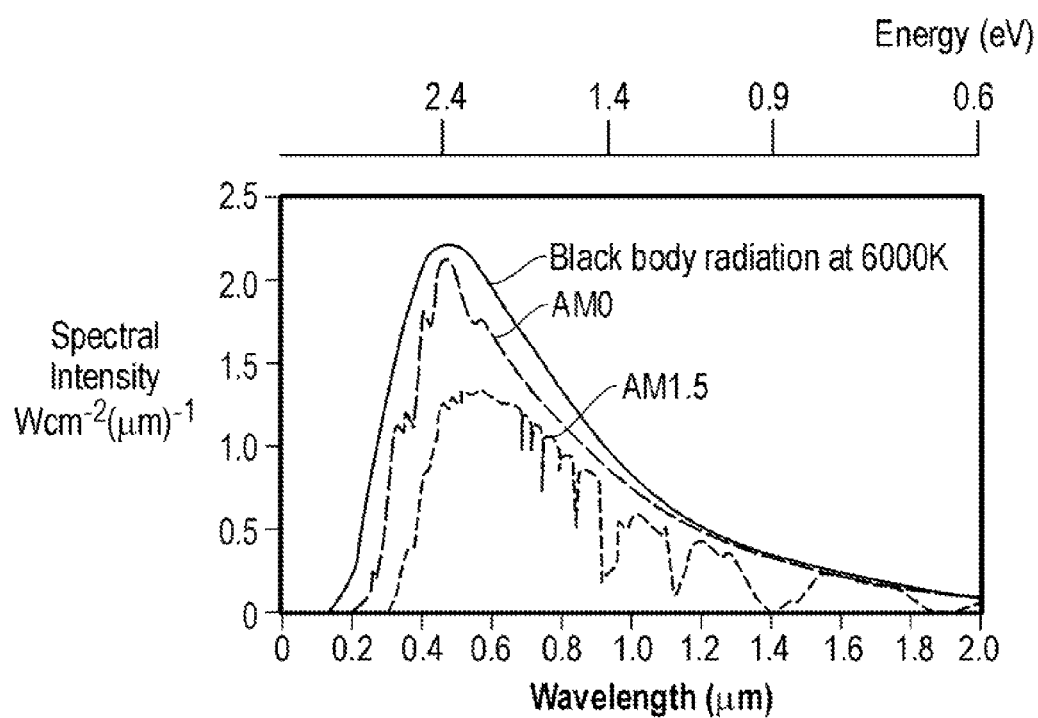
FIG. 4 is a graphical depiction of an air mass 1.5 solar spectrum.
Figure 5:
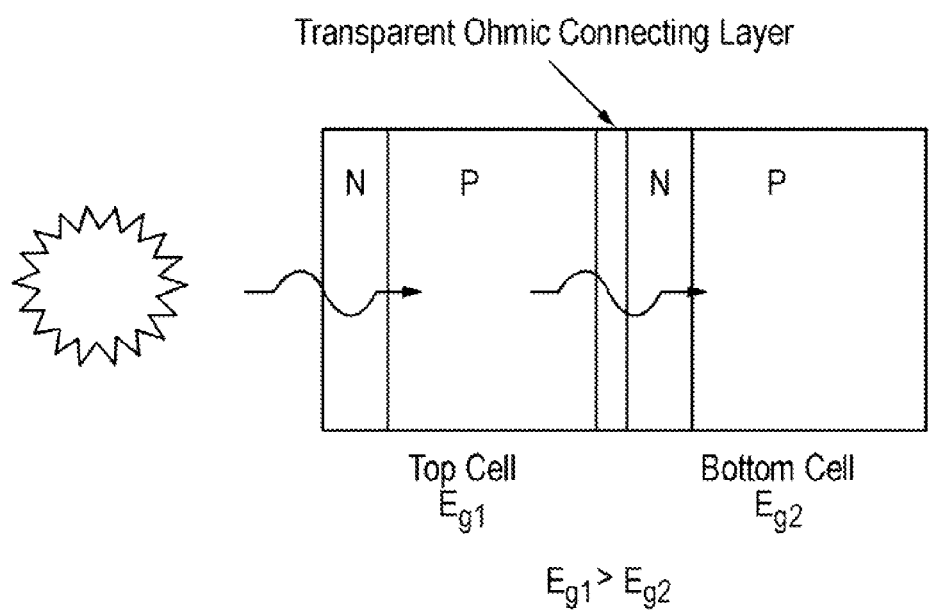
FIG. 5 is a cross-sectional representation of a known tandem solar cell.
Figure 6:
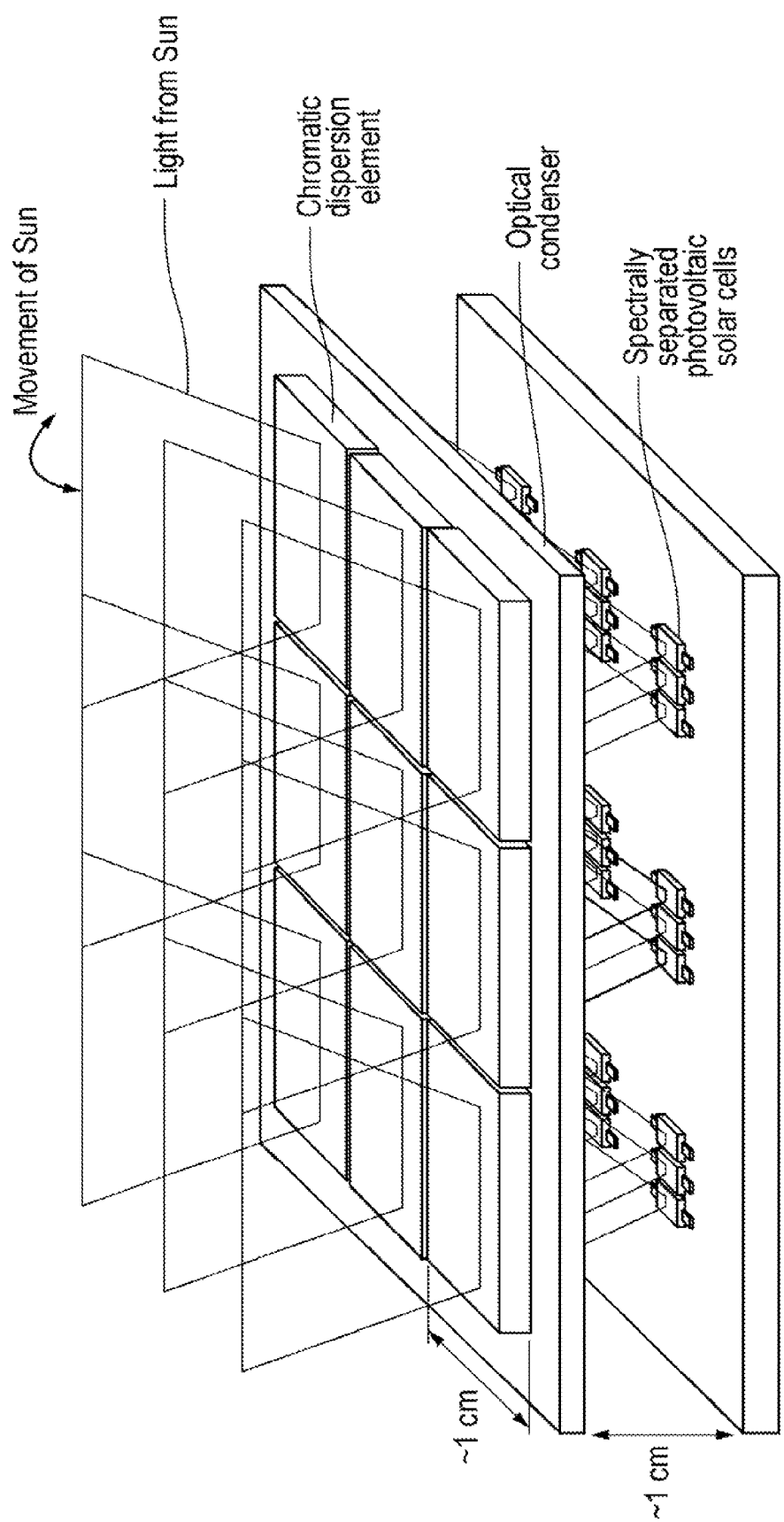
FIG. 6 is a perspective representation of a known type of lateral solar cell.

In a first embodiment of the shortpass filter 48 of FIG. 11, openings 66 in a metal mask 64 that transmits short wavelengths while reflecting long wavelengths. The filter or optical grating may also function as a surface collection grid for photo-generated carriers. Alternatively, the shortpass filter 48 of FIG. 11 may be a dichroic mirror or reflective grating that only transmits short wavelength light and reflects all incident larger wavelength light.

Referring to FIG. 1 for optical ray tracing, incident broad spectrum incident sunlight 24 is first concentrated (focused) by a micro-lens surface 22 to the refractive surface member 50 of a high-index material. The sunlight 24 is then redirected (refracted) to the surface 62 of a short-pass filter 48 that passes (transmits) short wavelength light signals (not shown) into the wide bandgap solar cell 42 and reflects the rest of the spectrum 24a to a micro-mirror 58, which then bounces (reflects) the filtered longer wavelength sunlight 24b into the narrower bandgap or longer wavelength solar cell material 40. In the alternate configuration, a longpass dichroic mirror would instead transmit long wavelength photons (not shown) and reflect shorter wavelength photons 24a. In either configuration, the integrated micro-lens layer 20 concentrates the incident sunlight by a factor of 2 times onto long strips of solar cells (photo-diodes) that are approximately one half the width of the micro-lens forming a structure with no unused or wasted space between the spectrally optimized solar cells C.

Thus, the present invention of a lateral multi-junction solar cell C has a surface area comparable to high-efficiency vertical multi-junction tandem solar cell with only a slight (<100

μm) increase in overall solar cell thickness. When compared to a conventional lateral solar cell and its fairly substantial system-level optics, the present low profile electro-optical system on chip lateral solar cell concept significantly reduces the overall weight, thickness, and volume of a comparably performing conventional lateral solar cell—with the thickness reduced by a factor of approximately 100×. Optical alignment is also greatly simplified and processing corrections for cell-to-cell misalignments are essentially eliminated because of the co-registered and simultaneous nature of the electro-optical system on chip.

Figure 7:
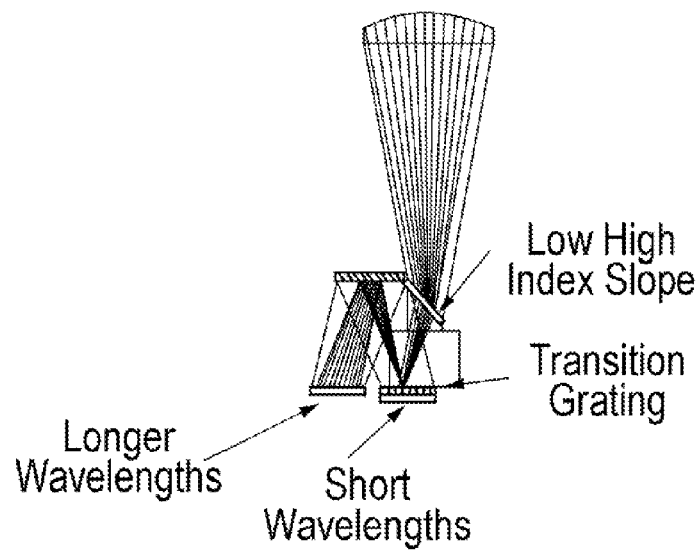
FIGS. 7 through 7C depict alternative embodiments of a micro-optical beam splitter model.
Figure 7A:
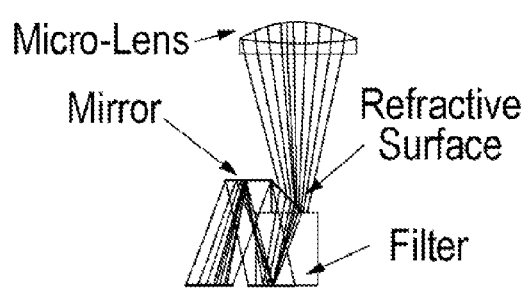
Figure 7B:
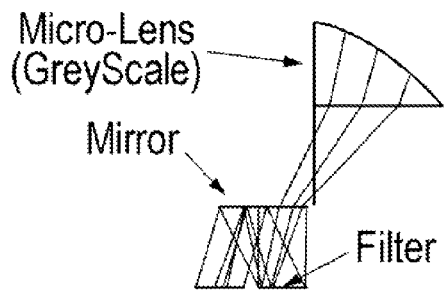
Figure 7C:
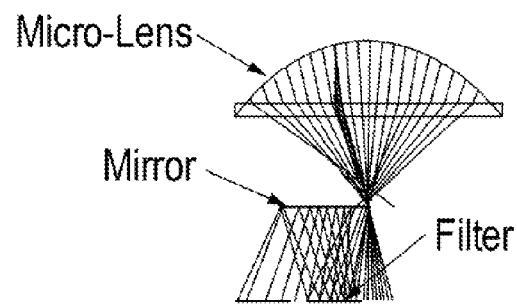

FIGS. 7 through 7C illustrate three different manufacturable designs for a micro-optical beam splitter. Note, the beam-splitter in FIG. 7A is identical to the beam-splitter described above. The beam splitter of FIG. 7B uses "grey scale" lithography to form the half micro-lens. The embodiment of FIG. 7B does not require a high index refractive surface, but sacrifices throughput efficiency at the lens edge.

A third beam-splitter embodiment is shown in FIG. 7C. This design is relatively simple to fabricate since it does not require the high index refractive surface or grey scale lithography. However, the design of FIG. 7C is less efficient than the designs of FIG. 7a or 7B because near the center of the two pixels reflections from the filter are not collected.

The planar micro-optic 'superstructure' portion of the present invention may be used with a number of suitable or known multi-junction photovoltaic layers. The photovoltaic layers underneath the micro-optics are intended to be representative of the types of materials and layers that could be used—but the present invention is not intended to be limited to InGaN on Silicon as shown in the figures. An alternative embodiment could include various semiconductor configurations such as Indium Gallium Phosphide (InGaP) on a Indium Gallium Arsenide (InGaAs) substrate, or alternatively Gallium Indium Phosphide ($GaInP_2$) on a Germanium (Ge) substrate.

Fabrication of the active solar cell (photovoltaic) semiconductor (PN junction) layer is well known in the semiconductor industry and consequently will not be further disclosed. The low-profile micro/nano optical components of the present invention may be fabricated using planar integrated circuit (microelectronics) fabrication technology.

A brief description of some of the available microelectronic processes for fabrication of some alternative embodiments of various micro/nano optical components of the solar cell C of the present invention is as follows.

Figure 8:
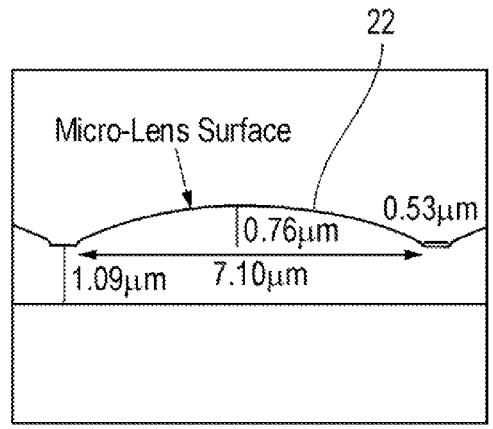
FIG. 8 is a cross-sectional depiction of a micro-lens surface fabricated for an optical component.

1. Micro-lens 20—these may be refractive, complex refractive (using gray scale lithography), binary, Fresnel or gradient index. The simple refractive lens or upper surface 22 is formed by defining a defined area and then flowing a resist substance into the desired profile. See FIG. 8. The resist profile is then replicated into the surface by ion milling or plasma etching. Gray scale lithography permits forming complex shapes into resist by varying resist exposure. Exposure and thus resist shape is varied by the density of small exposure openings in the photo mask rather than simple open or blocking exposure areas conventionally used. The complex shape is then replicated into the surface in the same manner as the simple lens. Fresnel lenses are formed by the same lithography techniques of profiling resist then ion milling the shape into the surface. Binary lenses are formed by simple patterning and etching of the surface. Gradient index lenses are fabricated by resist patterning and selective ion implantation or diffusion of "dopant" atoms into the lens substrate.

2. Mirror 58—this is a reflective layer fabricated from materials such as Aluminum or Gold. The metal layer is evaporated or sputtered onto a surface and photo-lithographically defined into the desired mirror shape.

Figure 9:
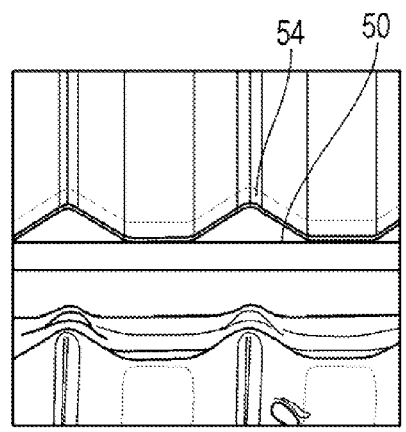
FIG. 9 similarly is a cross-sectional depiction of a refractive surface fabricated for an optical component.

3. Refractive surface 50—this is a sloped refractive upper surface 54 formed by photo-lithographically patterning resist into a designed shape (slope) and then replicating the resist shape into the high index material by etch. Silicon monoxide is an example of a high index material useful for visible systems. An alternate approach is to deposit the high index material under bias onto vertically defined shapes on the substrate. The bias is adjusted to form the desired slope. See FIG. 9.

4. Spectral or Dichroic filter—A window corresponding to the desired filter location is photo-lithographically defined in a thick resist layer. Optical thin film layers are sequentially deposited and the resist "lifted" to selectively form the spectral filters.

Figure 10:
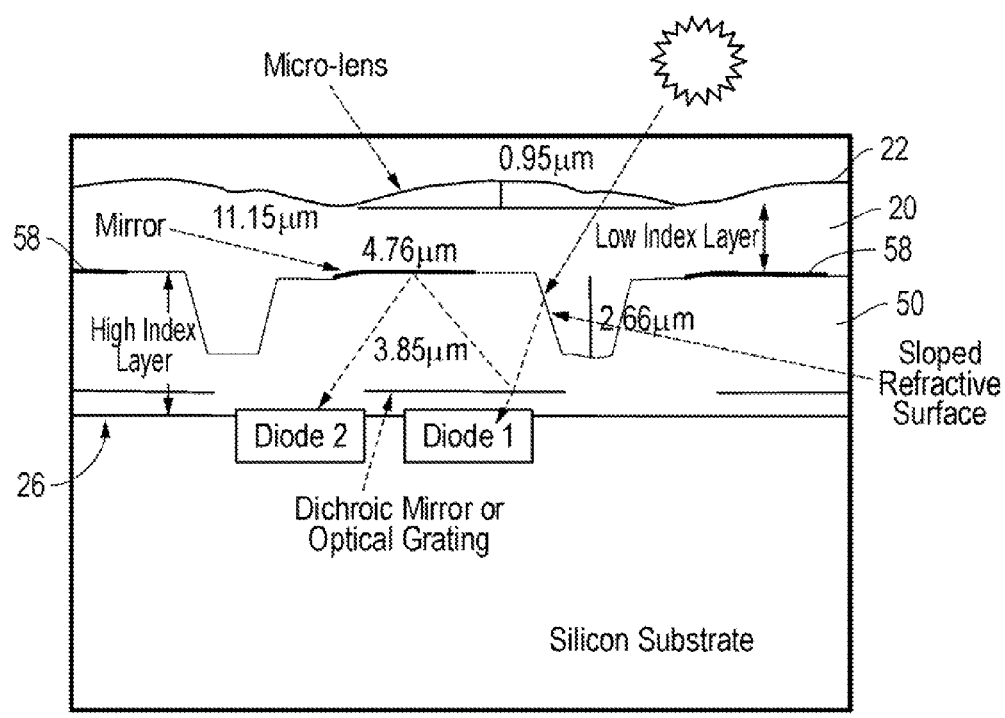
FIG. 10 depicts possible micro-optics results (SEM cross-section).

A similar micro-optics configuration may be used for an imaging sensor application such as that shown in the SEM cross-section of FIG. 10.

A method of manufacturing the present invention may include the following steps or procedures, but not necessarily in the specific order:

forming a P– type semiconductor substrate slab layer 26 having an upper surface 28 and a lower surface 30;

mating a P+ type semiconductor layer 32 having an upper surface 34 mated to the lower surface 30 of the P– type semiconductor substrate slab 26; the P+ semiconductor layer 32 further having an opposing lower surface 36 with an attached reflective backside contact layer 38;

apportioning the upper surface 28 of the P– type substrate slab layer 26 into a desired pattern of a plurality of alternating areas having N+ semiconductor segments 40 or Indium Gallium Nitride (InGaN) members 42; the N+ semiconductor segments 40 being formed beneath and extending essentially even with the upper surface 28 of the P– type semiconductor slab layer 26; and, the InGaN members 42 having a lower surface 44 in contact with the upper surface 28 of the P– type substrate slab layer 26 and forming a short wavelength color band photovoltaic cell;

forming a short-pass filter element 48 with an upper surface 46 of the InGaN members 42;

mating a lower surface 52 of a refractive surface member 50 formed from a high refractive index material with the upper surface 28 of the P– substrate slab layer 26;

forming a pattern of reflective mirrors 58 on the upper surface 54 of the refractive surface member 50 to reflect light 24 between the reflective mirrors 58 and the N+ semiconductor segments 40 and the beam splitter element 48 with the InGaN members 42; and, creating a micro-lens layer 20 having an upper surface 22 formed to concentrate incident light or similar signals 24 impinging on the solar cell C and a lower surface 56 mating with the upper surface 54 of the refractive surface member 50; the micro-lens layer 20 being formed from a low refractive index material.

The foregoing disclosure and description of the invention are illustrative and explanatory thereof, and various changes in the size, shape and materials, as well as in the details of the illustrated construction may be made without departing from the spirit of the invention.

The invention claimed is:

1. A monolithic high-efficiency lateral multi-junction tandem solar cell comprising:

a micro-lens layer having an upper surface formed to concentrate an incident light signal impinging on the solar cell; the micro-lens layer being formed from a low refractive index material that has been deposited, patterned, and etched directly onto a high refractive index material;

a primary semiconductor substrate slab layer having an upper surface and a lower surface;

the upper surface of the primary semiconductor substrate slab layer being apportioned into a desired pattern of a plurality of alternating areas having compatible first semiconductor segments or second photovoltaic cell members; the first semiconductor segments being formed beneath and extending essentially even with the upper surface of the primary semiconductor slab layer; and the second photovoltaic cell members having a lower surface in contact with the upper surface of the primary substrate slab layer and forming a short wavelength color band photovoltaic cell;

the second photovoltaic cell members having an opposing upper surface; a short-pass filter element being formed with the upper surface of the second photovoltaic cell members; the short-pass filter element of the second photovoltaic cell members includes a dichroic mirror transmitting only selected short wavelength light and reflecting all other incident longer wavelength light;

a plurality of refractive surface members formed from a high refractive index material deposited, patterned, and etched to refract incident light directly onto the dichroic filters and having a lower surface mating with the upper surface of the primary, semiconductor substrate slab layer and an upper surface mating with a lower surface of the micro-lens layer; and, a plurality of reflective micro-mirrors deposited, patterned, and etched on the upper surface of the refractive surface members to reflect and redirect light from the dichroic mirrors deposited on the second photovoltaic cell members to the first semiconductor segments.

2. The invention of claim 1 wherein the primary substrate layer is a P− type semiconductor material, and further including a P+ type semiconductor layer having an upper surface mated to the lower surface of the P− type semiconductor substrate slab; the P+ semiconductor layer further having an opposing lower surface with an attached reflective backside contact layer.

3. The invention of claim 1 wherein the second photovoltaic cell members comprise Indium Gallium Nitride (InGaN).

4. The invention of claim 1 wherein the short-pass filter element of the second photovoltaic cell members comprises a reflective grating transmitting only selected short wavelength light and reflecting all other incident longer wavelength light.

5. The invention of claim 4 wherein the reflective grating consists of openings in a metal mask member.

6. The invention of claim 1 wherein the primary semiconductor substrate slab layer comprises a P− type semiconductor and consists essentially of silicon.

7. The invention of claim 1 wherein the upper surface of the micro-lens layer is formed into a micro-lens configuration for desirably concentrating the impinging light.

8. An improved lateral multi-junction tandem solar cell of the type including a primary semiconductor substrate slab layer having an upper surface and a lower surface, and the upper surface of the primary substrate slab layer being apportioned into a desired pattern of a plurality of alternating areas having first semiconductor segments or second photovoltaic cell members, the improvement comprising:

a micro-lens layer having an- upper surface formed to concentrate an incident light signal impinging on the solar cell; the micro-lens layer being formed from a low refractive index material that has been deposited, patterned, and etched directly onto a high refractive index material;

the second photovoltaic cell members having a lower surface in contact with the upper surface of the primary substrate slab layer and forming a short wavelength color band photovoltaic cell; the second photovoltaic cell members further having an opposing upper surface; a short-pass filter element being formed with the upper surface of the second photovoltaic cell members; the short-pass filter element of the second photovoltaic cell members includes a dichroic mirror transmitting only selected short wavelength light and reflecting all other incident longer wavelength light;

a plurality of refractive surface members formed from a high refractive index material deposited, patterned, and etched to refract incident light directly onto the dichroic filters and having a lower surface mating with the upper surface of the primary substrate slab layer and an upper surface mating with a lower surface of the micro-lens layer; and, a plurality of reflective micro-mirrors deposited, patterned, and etched on the upper surface of the refractive surface member to reflect and redirect light from the dichroic mirrors deposited on the second photovoltaic cell members to the first semiconductor segments.

9. The invention of claim 8 wherein the primary substrate layer is a P− type semiconductor material, and further including a P+ type semiconductor layer having an upper surface mated to the lower surface of the P− type semiconductor substrate slab; the P+ semiconductor layer further having an opposing lower surface with an attached reflective backside contact layer.

10. The invention of claim 8 wherein the second photovoltaic cell members comprise Indium Gallium Nitride (InGaN).

11. The invention of claim 8 wherein the short-pass filter element of the second photovoltaic cell members comprises a reflective grating transmitting only selected short wavelength light and reflecting all other incident longer wavelength light.

12. The invention of claim 11 wherein the reflective grating consists of openings in a metal mask member.

13. The invention of claim 8 wherein the primary semiconductor substrate slab layer comprises a P− type semiconductor and consists essentially of silicon.

14. The invention of claim 8 wherein the upper surface of the micro-lens layer is formed into a micro-lens configuration for desirably concentrating the impinging light.

15. A method for monolithically manufacturing a high-efficiency lateral multi-junction tandem solar cell including the steps of:

forming a primary semiconductor substrate slab layer having an upper surface and a lower surface;

apportioning the upper surface of the primary substrate slab layer into a desired pattern of a plurality of alternating areas having compatible first semiconductor segments or second photovoltaic cell members; the first semiconductor segments being formed beneath and extending essentially even with the upper surface of the primary semiconductor slab layer; and, the second photovoltaic cell members having a lower surface in contact with the upper surface of the primary substrate slab layer and forming a short wavelength color band photovoltaic cell;

forming a short-pass filter element with an upper surface of the second photovoltaic cell members; the short-pass filter element of the second photovoltaic cell members includes a dichroic mirror transmitting only selected short wavelength light and reflecting all other incident longer wavelength light;

mating a lower surface of a refractive surface member formed from a high refractive index material deposited, patterned, and etched to refract incident light directly onto the dichroic filters with the upper surface of the primary semiconductor substrate slab layer;

depositing patterning, and etching a plurality of reflective micro-mirrors on the upper surface of the refractive surface members to reflect and redirect light from the dichroic mirrors deposited on the second photovoltaic cell members to the first semiconductor segments; and, creating a micro-lens layer having an upper surface formed to concentrate an incident light signal impinging on the solar cell and a lower surface mating with the upper surface of the refractive surface member; the micro-lens layer being formed from a low refractive index material.

16. The method of claim 15 wherein the primary substrate layer is a P− type semiconductor material, and further including a P+ type semiconductor layer having an upper surface mated to the lower surface of the P− type semiconductor substrate slab; the P+ semiconductor layer further having an opposing lower surface with an attached reflective backside contact layer.

17. The method of claim 15 wherein the second photovoltaic cell members comprise Indium Gallium Nitride (InGaN).

18. The method of claim 15 wherein the short-pass filter element of the second photovoltaic cell members comprises a reflective grating transmitting only selected short wavelength light and reflecting all other incident longer wavelength light.

19. The method of claim 18 wherein the reflective grating consists of openings in a metal mask member.

20. The method of claim 15 wherein the primary semiconductor substrate slab layer comprises a P− type semiconductor and consists essentially of silicon.

21. The method of claim 15 wherein the upper surface of the micro-lens layer is formed into a micro-lens configuration for desirably concentrating the impinging light.

\* \* \* \* \*